United States Patent [19]

Döenges et al.

[11] Patent Number: 4,458,006

[45] Date of Patent: Jul. 3, 1984

[54] PHOTOPOLYMERIZABLE MIXTURE AND PHOTOPOLYMERIZABLE COPYING MATERIAL PREPARED THEREWITH

[75] Inventors: Reinhard Döenges, Bad Soden; Klaus Horn, Hofheim, both of Fed. Rep. of Germany

[73] Assignee: Hoechst Aktiengesellschaft, Frankfurt am Main, Fed. Rep. of Germany

[21] Appl. No.: 504,136

[22] Filed: Jun. 14, 1983

[30] Foreign Application Priority Data

Jun. 21, 1982 [DE] Fed. Rep. of Germany ....... 3223104

[51] Int. Cl.³ .................... G03C 1/68; G03C 1/74
[52] U.S. Cl. ................................ 430/283; 430/288; 204/159.15
[58] Field of Search ............... 430/288, 285, 908, 910, 430/286; 204/159.15

[56] References Cited

U.S. PATENT DOCUMENTS

| | | | |
|---|---|---|---|
| 3,515,552 | 6/1970 | Smith | 96/35.1 |
| 3,661,576 | 5/1972 | Crary | 96/35.1 |
| 3,871,885 | 3/1975 | Hertler | 96/35.1 |
| 4,180,403 | 12/1979 | Nacci et al. | 430/281 |
| 4,264,708 | 4/1981 | Chambers et al. | 430/278 |
| 4,275,142 | 6/1981 | Hosaka et al. | 430/271 |
| 4,298,519 | 11/1981 | Cordes et al. | 260/33.8 UA |
| 4,308,338 | 12/1981 | Chambers et al. | 430/300 |
| 4,372,836 | 2/1983 | Schmitt et al. | 204/159.23 |

FOREIGN PATENT DOCUMENTS

| | | |
|---|---|---|
| 1521372 | 8/1978 | United Kingdom . |
| 1547839 | 6/1979 | United Kingdom . |
| 2059982 | 4/1981 | United Kingdom . |

Primary Examiner—John F. Kittle
Assistant Examiner—Cynthia Hamilton
Attorney, Agent, or Firm—Schwartz, Jeffery, Schwaab, Mack, Blumenthal & Koch

[57] ABSTRACT

Disclosed are a photopolymerizable mixture and photopolymerizable copy materials made therefrom. The mixture contains a polymerizable compound having terminal acrylic or methacrylic acid ester groups and being selected from a compound of the formula I

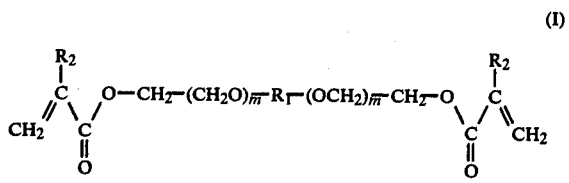

wherein
$R_1$ is a naphthylene group, a biphenyldiyl group or a dinaphthyl-methanediyl group or a group formed by two phenylene groups which are linked by a bridge comprised of an oxygen atom, a sulphur atom, a sulfone group or an alkylene group which is substituted by at least one carboxylic acid group, carboxylic acid alkyl ester groups, halogen atom or phenyl group, or by such a substituted alkylene group which is connected to the group $R_1$ of another molecule via said substituent;
$R_2$ is a hydrogen atom or a methyl group; and
m is 0 or 1, m being 1 if $R_1$ is a naphthylene group or a biphenyldiyl group.

7 Claims, No Drawings

PHOTOPOLYMERIZABLE MIXTURE AND PHOTOPOLYMERIZABLE COPYING MATERIAL PREPARED THEREWITH

BACKGROUND OF THE INVENTION

The present invention relates to a photopolymerizable mixture which contains, as the essential constituents, (a) a compound, which is polymerizable by a free-radical mechanism and has terminal ethylenically unsaturated groups; (b) a polymeric binder; and (c) a polymerization initiator which can be activated by radiation.

Photopolymerizable mixtures of this type have been disclosed, for example, in U.S. Pat. Nos. 2,760,836, 3,060,023 and 3,149,975. The polymerizable, ethylenically unsaturated compounds described in these publications are low-molecular weight and high-molecular weight compounds having terminal or lateral vinyl groups or vinylidene groups, in particular acrylates and methacrylates of low-molecular weight or high-molecular weight polyhydroxy compounds. In practice, photopolymerizable materials based on esters of this type as the polymerizable compounds have gained acceptance almost exclusively. Among these, the low-molecular weight representatives in particular are preferentially used for industrial purposes.

During the processing of photopolymerizable mixtures of the type mentioned above it is necessary to eliminate, or at least to suppress as far as possible, the influence of the oxygen present in the ambient air on the radical polymerization, which in most cases is achieved by covering the photopolymerizable layer with a removable cover sheet which is impermeable to oxygen (U.S. Pat. No. 3,060,026) or with a cover layer which is impermeable to oxygen and is soluble in the developer used (U.S. Pat. No. 3,458,311). By this measure it is prevented that, during the light-induced polymerization, oxygen diffuses into the layer and causes chain termination reactions which result in an incomplete polymerization and thus in a reduced light sensitivity of the layer.

It is a disadvantage of these known materials that an additional working step is required for the application of the cover film or cover layer. In addition, the image resolution is reduced when self-supporting cover films, which in general have a thickness of about 20 µm, are employed in contact copying processes. Cover layers which are soluble in developer lead to an increased developer consumption and to an additional pollution of the waste water. Therefore, attempts have been made to develop photopolymerizable materials which, even without a special cover layer, exhibit a sufficient light sensitivity in the imagewise polymerization.

DE-A No. 28 30 143 discloses a material of this type which contains specific, polymerizable compounds having a higher molecular weight, and specific initiator systems, and for this reason has a low sensitivity to oxygen. The polymerizable compounds employed are acrylates or methacrylates which have been obtained by reacting acrylic or methacrylic acid with bis-epoxy compounds.

Similar materials, which are preferentially employed for the production of photoresist images, are described in DE-A No. 26 02 410.

In addition to a number of advantages, these known materials have the disadvantage that only certain desired properties can be achieved by using them. For example, it is desired that photopolymerizable layers employed without an oxygen-inhibiting cover layer be non-tacky, but flexible and show no tendency to crystallize. In general, it is, however, impossible to achieve such a combination of properties without having to add further monomers which, in turn, have a negative effect on other advantageous properties.

SUMMARY OF THE INVENTION

It is, therefore, an object of the present invention to provide improved radiation-polymerizable mixtures.

It is a further object of the invention to provide radiation-polymerizable mixtures which are distinguished by a high radiation sensitivity and which do not crystallize but nevertheless produce non-tacky surfaces, in particular when no oxygen-inhibiting cover layer is applied.

Another object of the invention is to provide an improved photopolymerizable copy material produced from the photopolymerizable mixtures according to the invention.

In accomplishing the foregoing objects, there has been provided in accordance with one aspect of the present invention a mixture which is polymerizable by radiation, comprising:

(a) a polymerizable compound having terminal acrylic or methacrylic acid ester groups and being selected from a compound of the formula I

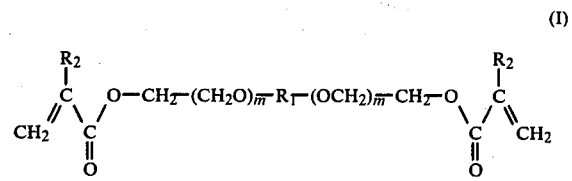

wherein
$R_1$ is a naphthylene group, a biphenylidiyl group or a dinaphthylmethanediyl group or a group formed by two phenylene groups which are linked by a bridge comprised of an oxygen atom, a sulphur atom, a sulfone group or an alkylene group which is substituted by at least one carboxylic acid group, carboxylic acid alkyl ester group, halogen atom or phenyl group, or by such as substituted alkylene group which is connected to the group $R_1$ of another molecule via said substituent;
$R_2$ is a hydrogen atom or a methyl group; and
m is 0 or 1, m being 1 if $R_1$ is a naphthylene group or a biphenyldiyl group, (b) a polymeric binder which is soluble or at least swellable in an aqueous-alkaline solution; and (c) a polymerization initiator which can be activated by radiation.

In accordance with another aspect of the present invention, there has been provided a photopolymerizable copy material, comprising a support and a layer of a photopolymerizable mixture as defined above placed upon the support. The photopolymerizable mixture layer may be in open exposure to the atmosphere, i.e., no oxygen impermeable cover layer is needed.

Further objects, features and advantages of the present invention will become apparent from the detailed description of preferred embodiments which follows.

DETAILED DESCRIPTION OF PREFERRED EMBODIMENTS

The invention is based on a radiationpolymerizable mixture which contains, as the essential components
(a) a compound which can be polymerized by a free-radical mechanism and contains terminal acrylic or methacrylic acid ester groups;
(b) a polymeric binder, which is soluble or at least swellable in aqueous-alkaline solutions; and
(c) a polymerization initiator which can be activated by radiation.

The mixture of the invention is characterized in that it contains, as the polymerizable compound (a), a compound according to the general formula I

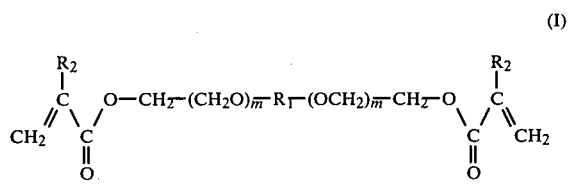

wherein
$R_1$ is a naphthylene group, a biphenyldiyl group or a dinaphthyl-methanediyl group or a group formed by two phenylene groups which are linked by a bridge which may be an oxygen or sulphur atom, a sulfone group or an alkylene group which has been substituted by carboxylic acid groups or carboxylic acid alkyl ester groups, halogen atoms or phenyl groups and which, via such a substituent, may optionally be connected to the group $R_1$ of another molecule;
$R_2$ is a hydrogen atom or a methyl group; and
m is 0 or 1, m being 1 if $R_1$ is a naphthylene group or a biphenyldiyl group.

Examples of possible $R_1$ groups are naphth-2,7-ylene, naphth-1,5-ylene, dinaphth-1-yl-methane-2,2'-ylene, biphenyl-4,4'-diyl and 1,1,1-triphenyl-ethane-4,4'-ylene. Those groups are preferred, in which two phenyl groups are connected by an oxygen or sulphur atom or by a substituted alkylene group, in particular by an oxygen atom or by an alkylene group substituted by a carboxylic acid ester group.

The polymerizable compounds contained in the mixture according to this invention can be prepared using known methods. It is, for example, possible to convert polyvalent phenols $HO-R_1-OH$ into bis-($\beta$-hydroxy-ethoxy) aromatic compounds by reacting them with ethylene carbonate, ethylene oxide, propylene oxide or styrene oxide (as described in Houben-Weyl, Methoden der Organischen Chemie (1965), Volume VI/3, pp. 75 ff. and pp. 79 ff.). By azeotropic esterification with acrylic or methacrylic acid, polymerizable compounds of the general formula I with m=1 are obtained from these bis-($\beta$-hydroxy-ethoxy) aromatic compounds.

Halogen methyl aromatic compounds of the formula $Hal-CH_2-R_1-CH_2-Hal$ can be directly reacted with an ethylenically unsaturated carboxylic acid in the presence of a base or with a metal salt of such an acid, whereby polymerizable compounds of the general formula I are produced, with m=0.

These compounds can also be prepared by reacting hydroxy-methyl aromatic compounds with the corresponding carboxylic acid halides or by re-esterifying the corresponding acetoxy-methyl compounds.

The photopolymerizable mixtures according to the present invention further contain polymeric binders, which are soluble or at least swellable in aqueous-alkaline solutions, since layers containing such binders can be developed with the preferably employed aqueous-alkaline developers. Binders of this type can, for example, contain the following groups: $-COOH$, $-PO_3H_2$, $-SO_3H$, $-SO_2NH_2$, or $-SO_2-NH-CO-$. Examples of these are: maleate resins, polymers of $\beta$-methacryloyloxy-ethyl N-(p-tolyl-sulfonyl)-carbamate and copolymers of these and similar monomers with other monomers, methyl methacrylate/methacrylic acid copolymers, or copolymers of methacrylic acid, alkyl methacrylates and methyl methacrylate and/or styrene, acrylonitrile and the like. The preferred binders are, however, copolymers of styrene and maleic acid anhydride or of styrene and maleic acid esters.

A large number of substances can be used as photoinitiators in the mixtures according to the invention. Examples are benzoin, benzoin ethers, polynuclear quinones, for example, 2-ethyl-anthraquinone, acridine derivatives, for example 9-phenyl-acridine, 9-p-methoxyphenyl-acridine, 9-acetylamino-acridine and benz(a)acridine; phenazine derivates, for example, 9,10-dimethyl-benz(a)phenazine, 9-methyl-benz(a)phenazine and 10-methoxy-benz(a)phenazine; quinoxaline derivatives, for example, 6,4',4''-trimethoxy-2,3-diphenyl-quinoxaline and 4',4''-dimethoxy-2,3-diphenyl-5-aza-quinoxaline or quinazoline derivatives.

In addition to monomers, binders and photoinitiators, the mixtures according to this invention may contain various other conventionally used additives, such as inhibitors to prevent thermal polymerization of the monomers, hydrogen donors, sensitometric modifiers, dyestuffs, and/or colored and uncolored pigments.

These constituents advantageously should be selected such that their absorption is as low as possible in the range of actinic radiation, which is important for the initiation process.

Within the scope of this invention, actinic radiation is to be understood as any radiation, the energy of which corresponds at least to that of shortwave visible light. Longwave UV-radiation, but also electron radiation, X-rays and laser radiation are particularly suitable.

By means of the photopolymerizable layers produced using the mixtures according to this invention, photopolymerizable layers which possess a high sensitivity to light are obtained, even if no oxygen-inhibiting cover layer is applied. The cover layer-free layers show no signs of tackiness and in the exposed state are resistant to alkaline developers and acid alcoholic fountain solutions.

The manufacture of light-sensitive materials with the mixture of the invention is carried out in the known manner. For example, the mixture can be dissolved in a solvent, and the solution or dispersion is then applied to the respective support as a thin film by die-coating, spraying, dip-coating or roller application, and subsequently dried.

The copying layers are exposed and developed in the known manner. Suitable developers are aqueous, preferably aqueous-alkaline solutions, for example, of alkali metal phosphates or alkali metal silicates, which may contain small quantities of miscible organic solvents and surfactants.

The mixtures according to the invention can be used particularly advantageously in the form of presensitized copying materials on suitable supports, such as, for example, aluminum or zinc, for the photomechanical production of offset printing plates. Further possible applications are the production of dry resist films, relief images, screen printing stencils and color proofing films, or the use as a photoresist solution.

In the text which follows, the preparation of the polymerizable compounds is initially explained. The examples which follow describe individual embodiments of the mixture according to the invention. The quantities of the individual layer components employed are indicated in parts by weight (p.b.w.). Unless otherwise stated, percentage ratios and quantity ratios are to be understood as weight units.

The compounds of general formula I are prepared as follows:

A. Alkoxylation of phenols of the formula
$$HO—R_1—OH$$

(a) 22 g (0.5 mole) of ethylene oxide are added to a mixture of 22 g (0.11) mole of 4,4'-dihydroxydiphenyl ether, 2 g of sodium hydroxide and 200 ml of water, at 95°–100° C. during about 5 hours. After cooling down, the product is filtered by suction and dried. Yield: 27 g (0.093 mole; 85%); melting point 133°–135° C.

(b) At a temperature of 95°–100° C., 66 g (1.5 moles) of ethylene oxide are added to a mixture of 150 g (0.5 mole) of 2,2-bis-(4-hydroxy-phenyl)-acetic acid butyl ester, 10 g of sodium hydroxide and 400 ml of water. The reaction mixture is cooled down, and the product is extracted from the aqueous phase by means of ethyl acetate. The solvent is distilled off in vacuo. 140 g (0.36 mole, 72%) of the oily product are obtained.

(c) A mixture of 75 g (0.4 mole) of 4,4'-dihydroxybiphenyl, 78 g (0.88 mole) of ethylene carbonate and 2 g of pulverized potassium hydroxide is heated to 170°–190° C. for 2 hours. After cooling down, the barely soluble product is freed from remainders of the starting materials by washing with ethyl acetate. Yield: 84 g (0.3 mole; 75%)

B. Azeotropic esterification of alkoxylated phenols (a) 10 ml of concentrated sulphuric acid are added to a solution of 1 mole of 4,4'-bis-hydroxy-ethoxydiphenyl ether and 0.5 g of hydroquinone in 500 ml of toluene, and the mixture is heated to a boil at the water separator. 3 moles of methacrylic acid are slowly added dropwise, whereby 40 ml of an aqueous phase are separated off in the water separator.

The toluene solution is washed with 2N of sodium hydroxide solution and with water. After concentration in vacuo, the solvent remainders which may still be present are evaporated at 60° C. and 0.1 Torr. 328 g (77%) of 4,4'-bis-(β-methacryloyloxy-ethoxy)-diphenyl ether are obtained (compound 9).

If acrylic acid is used instead of methacrylic acid, 278 g (70%) of 4,4'-bis-(β-acryloyloxy-ethoxy)-diphenyl ether are obtained (compound 10).

(b) 39 g (0.1 mole) of 2,2-bis-(4-hydroxy-ethoxyphenyl) acetic acid butyl ester are dissolved in 350 L ml of toluene. Then 0.4 g of hydroquinone and 4 ml of concentrated sulphuric acid are added. While the mixture is being heated to a boil, 42 g (0.5 mole) of methacrylic acid are slowly added dropwise, whereby 3.7 ml of an aqueous phase are separated off at the water separator. After washing out with 2N of sodium hydroxide solution and concentrating of the organic phase, 39 g (74%) of compound 13 are obtained.

(c) 27.5 g (36.8 moles) of bis(2,2-bis(4-hydroxyethoxy-phenyl)butyric acid) ethylene glycol ester, 1.5 ml of concentrated sulphuric acid and 0.15 g of hydroquinone are heated in 200 ml of toluene, and 19 g (0.22 mole) of methacrylic acid are added dropwise. After 3.2 ml of an aqueous phase have been separated off at the water separator, washing is performed with 2N of sodium hydroxide, and the solvent is distilled off. 28 g (27.5 moles; 75%) of compound 24 are obtained.

TABLE I

Examples of compounds of the general formula I with $m = 1$:

| compound No. | $R_1$ | $R_2$ |
|---|---|---|
| 1 | (bis-naphthyl-CH$_2$ structure) | CH$_3$ |
| 2 | (bis-naphthyl-CH$_2$ structure) | H |
| 3 | —phenyl—SO$_2$—phenyl— | CH$_3$ |
| 4 | —phenyl—SO$_2$—phenyl— | H |
| 5 | (naphthalene) | CH$_3$ |
| 6 | (naphthalene) | H |

TABLE I-continued

Examples of compounds of the general formula I with m = 1:

| compound No. | R₁ | R₂ |
|---|---|---|
| 7 | 2,7-naphthalenediyl | CH₃ |
| 8 | 2,7-naphthalenediyl | H |
| 9 | 4,4'-oxydiphenylene (–C₆H₄–O–C₆H₄–) | CH₃ |
| 10 | 4,4'-oxydiphenylene (–C₆H₄–O–C₆H₄–) | H |
| 11 | –C₆H₄–CH(COOCH₃)–C₆H₄– | CH₃ |
| 12 | –C₆H₄–CH(COOCH₃)–C₆H₄– | H |
| 13 | –C₆H₄–CH(COOC₄H₉)–C₆H₄– | CH₃ |
| 14 | –C₆H₄–CH(COOC₄H₉)–C₆H₄– | H |
| 15 | 4,4'-biphenylene | CH₃ |
| 16 | 4,4'-biphenylene | H |
| 17 | 1,4-naphthalenediyl | CH₃ |
| 18 | 1,4-naphthalenediyl | H |
| 19 | –C₆H₄–C(H)(CCl₃)–C₆H₄– | CH₃ |
| 20 | –C₆H₄–C(CH₃)(C₆H₅)–C₆H₄– | CH₃ |
| 21 | –C₆H₄–C(CH₃)(C₆H₅)–C₆H₄– | H |
| 22 | –C₆H₄–C(CH₃)(CH₂COOCH₃)–C₆H₄– | CH₃ |
| 23 | –C₆H₄–C(CH₃)(CH₂COOCH₃)–C₆H₄– | H |
| 24 | –C₆H₄–C(CH₃)(CH₂–CO–O–CH₂–)–C₆H₄– (dimeric ester linkage, see structure) | CH₃ |
| 25 | –C₆H₄–C(CH₃)(CH₂CH₂COOH)–C₆H₄– | CH₃ |

TABLE I-continued

Examples of compounds of the general formula I with m = 1:

| compound No. | R₁ | R₂ |
|---|---|---|
| 26 | -C₆H₄-C(CH₃)(CH₂-COO-t-C₄H₉)-C₆H₄- | CH₃ |
| 27 | -C₆H₄-C(CH₃)(CH₂-CH₂-COOC₂H₅)-C₆H₄- | CH₃ |

Examples of the preparation of compounds of general formula I with m=0:

(a) 78 g (0.2 mole) of 4,4'-bis-bromomethyl-diphenyl ether, 42.5 g (0.42 mole) of triethylamine, 36 g (0.42 mole) of methacrylic acid and 0.5 g of hydroquinone are heated in 300 ml of toluene to 80° C. for 4 hours. The precipitated ammonium bromide is filtered off by suction, and the product is washed with 2N of sodium hydroxide solution, 2N of hydrochloric acid and with water, and concentrated. 56.6 g (0.154 mole; 77%) of 4,4'-bis(methacryloyloxy-methyl)diphenyl ether are obtained (compound 28).

(b) 570 g (1.6 mole) of 4,4'-bis-bromomethyl-diphenyl ether, 413 g (4.8 moles) of methacrylic acid and 1.6 g of hydroquinone are dissolved in 2.5 l of methyl-isobutyl ketone and, after the dropwise addition of 725 g of triethylamine, refluxed for 5 hours. The product is filtered off the precipitated triethylammonium bromide by suction and repeatedly washed with 2N of sodium hydroxide solution, 2N of hydrochloric acid and water. 0.4 g of hydroquinone are added, and the organic phase is concentrated. 350 g (0.96 mole; 60%) of compound 28 are obtained.

(c) 20 g of 4,4'-bis-acetoxymethyl-diphenyl ether are dissolved in 100 ml of methacrylic acid, some hydroquinone and 1 ml of concentrated sulphuric acid are added, and the mixture is heated to about 80° C. for 8 hours. Then 500 ml of methylene chloride are added, and the organic phase is washed with 2N of sodium hydroxide solution and with water. After concentration 15 g (64%) of compound 28 are obtained.

(d) In the presence of 1.4 g of hydroquinone, 570 g (1.6 moles) of 4,4'-bis-bromomethyl-diphenyl ether and 346 g (4.8 moles) of acrylic acid are reacted in 2.5 l of methyl-isobutyl ketone by dropwise adding 960 g of triethylamine. Processing is carried out as described under (b). 360 g (1.065 moles; 67%) of 4,4'-bis-(acryloyloxy-methyl) diphenyl ether are obtained (compound 29).

(e) 142 g (0.4 mole) of 4,4'-bis-bromomethyl-diphenylether, 86.4 g (1.2 moles) of acrylic acid and 0.4 g of hydroquinone monomethyl ether are dissolved in 700 ml of acetone. Then 255 g of triethylamine are dropwise added, and the mixture is refluxed for 5 hours. Filtering by suction from ammonium bromide is subsequently carried out, the product is concentrated, redissolved in methylene chloride, washed with 2N of sodium hydroxide solution, 2 n of hydrochloric acid and water, and concentrated again. 66.2 g (0.196 mole; 49%) of compound 29 are obtained.

(f) 15 g (60 mmoles) of 4,4'-bis-hydroxy-methyl diphenyl ether and 30 g of triethylamine are dissolved in methylene chloride, and 27 g (0.3 mole) of acryloylchloride, dissolved in some methylene chloride, are added dropwise at 10° C. After two hours at room temperature, the product is washed with water, and the solvent is distilled off in vacuo. 15.5 g (46 moles; 76%) of compound 29 are obtained.

(g) 18.6 g of 4,4'-bis-bromomethyl-diphenyl sulfide, 13 g of methacrylic acid and 0.3 g of hydroquinone are refluxed for 5 hours in 250 ml of chloroform, with 45 ml of triethylamine. The product is filtered by suction, and washed with 2N of HCl, 2N of NaOH and with water. After concentration, 12.6 g (66%) of compound 30 are obtained.

TABLE II

Examples of compounds of the formula I with m = 0:

| compound No. | R₁ | R₂ |
|---|---|---|
| 28 | -C₆H₄-O-C₆H₄- | CH₃ |
| 29 | -C₆H₄-O-C₆H₄- | H |
| 30 | -C₆H₄-S-C₆H₄- | CH₃ |
| 31 | -C₆H₄-S-C₆H₄- | H |

EXAMPLE 1

Electrochemically roughened and anodized aluminum, having an oxide layer of 3 g/m², which had been pretreated with an aqueous solution of polyvinylphosphonic acid, was used as the support for printing plates.

This support was spin-coated with a solution of the following composition:

2 p.b.w. of a copolymer of styrene and maleic acid anhydride having a mean molecular weight of 20,000 and an acid number of 180–200 (Scripset 540, produced by Monsanto)

2 p.b.w. of compound 13

0.125 p.b.w. of 9-phenyl-acridine, and 0.06 p.b.w. of the azo dyestuff obtained from 2,4-dinitro-6-chloro-benzenediazonium salt and 2-methoxy-5-acetylamino-N-cyanoethyl-N-hydroxy-ethyl-aniline, in 26 p.b.w. of butanone, and 14 p.b.w. of butyl acetate.

The application was effected in such a way that a dry layer weight of 3.7–4 g/m² was obtained. The, the plate was dried for 2 minutes at 100° C. in a circulating air drying cabinet.

The printing plate obtained was exposed for 40 seconds, using a 5 kW metal halide lamp and at a distance of 110 cm between lamp and vacuum copying frame, under a 13-step exposure wedge with density increments of 0.15.

Subsequently, the plate was developed manually with a developer of the following composition:
3.0 b.p.w. of sodium metasilicate×9 H$_2$O,
0.03 p.b.w. of a non-ionic surfactant (coconut fatty alcohol polyoxyethylene ether with about 8 oxyethylene units),
0.003 p.b.w. of an anti-foam agent, and
96.967 p.b.w. of deionized water.

5 completely cross-linked wedge steps were obtained.

EXAMPLE 2

0.04 g of amorphous, highly porous silicic acid havig a mean particle size of 8 μm (Syloid Al 1) was added to the coating solution of Example 1. The dispersion obtained was spin-coated onto a layer support, in a way such that a layer weight of 3.5 g/m$^2$ was obtained.

The plate was processed as described in Example 1.
5 completely cross-linked wedge steps were obtained.

In a conventional damping unit, 180,000 prints were obtained from this printing plate; in an alcohol damping unit 90,000 prints were obtained.

EXAMPLE 3

After drying, the coated plate of Example 2 was coated with a 15% strength aqueous solution of polyvinyl alcohol (12% residual acetyl groups, K-value 4). A cover layer having a dry weight of 5 g/m$^2$ was obtained.

Portions of the plate were exposed for 5, 10, 20 and 40 seconds, using a metal halide lamp, under a 13-step exposure wedge having density increments of 0.15; developing was then performed with the developer solution described under Example 1.

In another test, the plate was heated after exposure at 100° C. in a circulating air drying cabinet for 5 seconds, and subsequently developed.

The following table shows that the layer works strictly reciprocally and that the post-heating step results in a clear increase of the number of completely cross-linked steps:

| Exposure time (seconds) | 5 | 10 | 20 | 40 |
|---|---|---|---|---|
| Wedge steps without post-heating | 3 | 5 | 7 | 9 |
| Wedge steps with post-heating | 8 | 9 | 11 | 13 |

If layers are prepared using other monomers (for example, trimethylol-ethane triacrylate), the number of cross-linked steps under the influence of oxygen (i.e., when no cover layer is applied) is much lower than in cases where a cover layer has been applied (3 wedge steps without a cover layer, 9 wedge steps with a cover layer, at an exposure time of 40 seconds).

EXAMPLE 4

A coating solution was prepared from
1 p.b.w. of a methyl methacrylate/methacrylic acid copolymer having a molecular weight of 30,000 and an acid number of 117,
1 p.b.w. of the styrene/maleic acid anhydride copolymer of Example 1,
2 p.b.w. of compound 29,
0.125 p.b.w. of 9-phenyl-acridine,
0.07 p.b.w. of the blue dyestuff of Example 1,
0.04 p.b.w. of the silicic acid of Example 2, in
21 p.b.w. of butanone, and
11 p.b.w. of butyl acetate.

This solution was spin-coated onto the aluminum support described in Example 1, in a way such that a layer weight of 5 g/m$^2$ was obtained.

Exposure, developing and evaluation were carried out as described in Example 1.

4 completely cross-linked wedge steps were obtained.

EXAMPLE 5

The layer support described in Example 1 was spin-coated with the following solutions, in such a way that a layer weight of 3.5 g/m$^2$ resulted:
2 p.b.w. of the copolymer of Example 1,
1.8 p.b.w. of one of the compounds listed in Table III below,
0.5 p.b.w. of 9-phenyl-acridine, and
0.05 p.b.w. of the azo dyestuff of Example 1, in
23 p.b.w. of butanone,
12 p.b.w. of butyl acetate, and
12 p.b.w. ethylene glycol monomethyl ether.

The plates were exposed for 40 seconds and developed with the developer solution of Example 1.

The following numbers of completely cross-linked wedge steps were obtained:

TABLE III

| Compound No. | Wedge Steps | Compound No. | Wedge Steps |
|---|---|---|---|
| 1 | 3 | 20 | 3 |
| 2 | 1–2 | 21 | 3 |
| 3 | 2 | 22 | 5 |
| 4 | 2–3 | 23 | 5 |
| 5 | 1–2 | 24 | 5 |
| 6 | 1–2 | 25 | 3 |
| 7 | 1 | 28 | – |
| 8 | 2 | 29 | – |
| 9 | 2–3 | 30 | 2 |
| 10 | 2 | 31 | 3–4 |
| 11 | 3 | | |
| 12 | 2 | | |
| 13 | 2 | | |
| 14 | 1–2 | | |
| 15 | 2 | | |
| 16 | 1–2 | | |
| 17 | 2 | | |
| 18 | 1 | | |

EXAMPLE 6

A solution of
6.5 p.b.w. of a terpolymer of n-hexylmethacrylate, methacrylic acid and styrene (60:30:10 p.b.w.), having a mean molecular weight of about 35,000,
5.6 p.b.w. of the monomer of Example 1,
0.2 p.b.w. of 9-phenyl-acridine, and
0.03 p.b.w. of the blue azo dyestuff of Example 1, in
25 p.b.w. of butanone,
2 p.b.w. of ethanol, and
1 p.b.w. of butyl acetate
was spin-coated onto a biaxially stretched and thermoset 25 μm thick polyethylene terephthalate film, in such a way that after drying at 100° C. a layer weight of 35 g/m$^2$ was obtained.

By means of a conventional laminating apparatus, the dry resist film thus prepared was laminated at 120° C.

onto a phenoplast laminate sheet, to which a 35 μm copper foil had been bonded, and exposed for 20 seconds with a conventional exposure apparatus. A line original having line widths and spacings of down to 80 μm was used as the original.

After exposure, the polyester film was removed and the layer was developed for 90 seconds with the developer solution of Example 1 in a spray developing device.

The plate was then rinsed for 30 seconds with tap water, etched for 30 seconds in a 15% strength ammoniumperoxydisulfate solution, and then electroplated successively in the following electroplating baths:

(1)

30 minutes in a "Glanzkupfer-Bad" type copper electrolyte bath made by Schloetter, Geislingen/Steige;
current density: 2.5 A/dm²
metal buildup: 14 μm.

(2)

10 minutes in a "Norma" type nickel bath made by Schloetter, Geislingen/Steige;
current density: 4 A/dm²
metal buildup: 9 μm.

The plate showed no undercutting or damage.

It was then possible to decoat the plate in a 5% KOH solution at 50° C., and the exposed copper could be removed by etching in the customary etching media.

EXAMPLE 7

The photoresist solution of Example 6 was spin-coated in the manner described, onto a phenoplast laminate sheet, to which a 35 μm thick copper film had been bonded, and dried (layer weight 30 g/m²).

As described in Example 6, the plate was exposed, developed and electroplated, whereby the following bath was used instead of the nickel bath:

15 minutes in a lead-tin bath "LA" made by Schloetter, Geisingen/Steige;
current density: 1 A/dm²
metal buildup: 15 μm.

This plate, too, did not show any signs of undercuttings or damage. It could be decoated with a KOH solution and etched with customary etching agents.

TABLE IV

| Compound No. | Wedge Steps |
|---|---|
| 1 | 2 |
| 3 | 4 |
| 4 | 3 |
| 5 | 1 |
| 6 | 1 |
| 7 | 4 |
| 8 | 3 |
| 9 | 5 |
| 15 | 2 |
| 16 | 1 |
| 23 | 5 |
| 28 | 7 |
| 29 | 7-8 |

EXAMPLE 8

The layer support described in Example 1 was spin-coated with the following solution, in a way such that a layer weight of 3.5 g/m² was obtained.

2.6 p.b.w. of compound 28, 6.5 p.b.w. of a styrene/maleic acid ester copolymer having an acid number of 145-160 and a softening point of 140°-160° C., 70 p.b.w. of ethylene glycol monomethyl ether, 0.1 p.b.w. of 9-phenyl-acridine 0.035 p.b.w. of the azo dyestuff described in Example 1, and 1.0 p.b.w. of the reaction product of 1 mole of 2,2,4-trimethyl-hexamethylene diisocyanate and 2 moles of 2-hydroxyethylmethacrylate.

Thereafter, the coated plate was dried for 2 minutes at 100° C. in a circulating air drying cabinet and provided with a cover layer as described in Example 3. By means of a ®Laserite 150 R apparatus made by EOCOM Corp., which was equipped with an argon ion laser, the plate was then irradiated with 200 mW and 1,220 lines/inch (5.3 mJ/cm²). The image contrast after irradiation was good. Subsequently, the plate was developed with the developer described in Example 1. When the exposure was immediately followed by developing, the number of completely cross-linked wedge steps on a continuous tone step wedge was 3.

When the plate was identically processed, with the only difference being that the plate was heated to 80° C. for 7 seconds between exposure and developing, 5 wedge steps were obtained.

Proof-printing and printing were performed on an offset printing machine of the type GTO, made by Heidelberger Druckmaschinen and possessing a Dahlgren damping device. The number of prints achieved was 100,000 without intermediate heating, and 150,000 with intermediate heating.

What is claimed is:

1. A mixture which is polymerizable by radiation, comprising:

(a) a polymerizable compound having terminal acrylic or methacrylic acid ester groups and being selected from a compound of the formula I

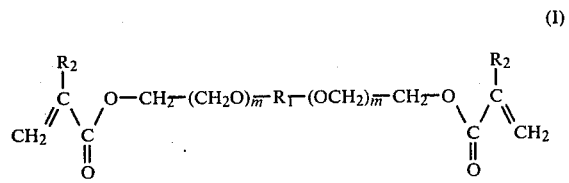

(I)

wherein
$R_1$ is a naphthylene group, a biphenyldiyl group or a dinaphthylmethanediyl group or a group formed by two phenylene groups which are linked by a bridge comprised of an oxygen atom, a sulphur atom, a sulfone group or an alkylene group which is substituted by at least one carboxylic acid group, carboxylic acid alkyl ester groups, halogen atom or phenyl group, or by such a substituted alkylene group which is connected to the group $R^1$ of another molecule via said substituent;
$R_2$ is a hydrogen atom or a methyl group; and
m is 0 or 1, m being 1 if $R_1$ is a naphthylene group or a biphenyldiyl group;

(b) a polymeric binder which is soluble or at least swellable in an aqueous-alkaline solution; and (c) a polymerization initiator which can be activated by radiation.

2. A mixture as claimed in claim 1, wherein in the compound according to formula I, $R_2$ is a methyl radical.

3. A mixture as claimed in claim 1, wherein in the compound according to formula I, $R_1$ is a diphenyl ether group.

4. A mixture as claimed in claim 1, wherein in the compound according to formula I, $R_1$ is a diphenyl alkanoic ester group.

5. A mixture as claimed in claim 1, wherein in the compound according to formula I, $R_1$ is selected from the groups naphth-2,7-ylene, naphth-1,5-ylene, di-naphth-1-yl-methane-2,2'-ylene, biphenyl-4,4'-diyl and 1,1,1-triphenyl-ethane-4,4'-ylene.

6. A photopolymerizable copy material, comprising:
 a support layer; and
 a layer of a photopolymerizable mixture as defined according to claim 1 placed upon said support layer.

7. A photopolymerizable copy material as claimed in claim 6, wherein said photopolymerizable mixture layer is in open exposure to the atmosphere.

* * * * *